United States Patent
Bernard et al.

(10) Patent No.: US 12,256,212 B2
(45) Date of Patent: Mar. 18, 2025

(54) LOGIC FOR REVERBERATION TIME ESTIMATION

(71) Applicant: Apple Inc., Cupertino, CA (US)

(72) Inventors: Benjamin Bernard, Monaco (MC); Prateek Murgai, San Francisco, CA (US); Juha O. Merimaa, San Mateo, CA (US); Jonathan D. Sheaffer, San Jose, CA (US); Soenke Pelzer, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 248 days.

(21) Appl. No.: 18/156,938

(22) Filed: Jan. 19, 2023

(65) Prior Publication Data

US 2023/0276190 A1    Aug. 31, 2023

Related U.S. Application Data

(60) Provisional application No. 63/268,633, filed on Feb. 28, 2022.

(51) Int. Cl.
| | |
|---|---|
| H03G 3/00 | (2006.01) |
| G10L 25/78 | (2013.01) |
| H03G 5/16 | (2006.01) |
| H04R 3/00 | (2006.01) |
| H04S 7/00 | (2006.01) |
| H03G 3/20 | (2006.01) |

(52) U.S. Cl.
CPC .............. *H04S 7/305* (2013.01); *G10L 25/78* (2013.01); *H03G 5/165* (2013.01); *H04R 3/005* (2013.01)

(58) Field of Classification Search
CPC ......... H04S 7/305; G10L 25/78; H03G 5/165; H04R 3/005
USPC ...................................... 381/63, 57
See application file for complete search history.

(56) References Cited

U.S. PATENT DOCUMENTS

| | | |
|---|---|---|
| 9,743,181 B2 | 8/2017 | Choisel et al. |
| 10,244,314 B2 | 3/2019 | Kriegel et al. |
| 2017/0278519 A1* | 9/2017 | Visser .................... H04R 3/005 |

OTHER PUBLICATIONS

Unpublished U.S. Appl. No. 17/308,778, filed May 5, 2021, 32 pages.
Unpublished U.S. Appl. No. 17/821,022, filed Aug. 19, 2022, 38 pages.

* cited by examiner

*Primary Examiner* — Ammar T Hamid
(74) *Attorney, Agent, or Firm* — Aikin & Gallant, LLP

(57) ABSTRACT

A plurality of microphone signals of a microphone array may be obtained. An environment change may be detected based on the microphone signals. In response, a reverberation time environment may be determined. The reverberation may be used to modify a playback audio signal.

24 Claims, 6 Drawing Sheets

LOGIC FOR REVERBERATION TIME ESTIMATION

CROSS REFERENCE TO RELATED APPLICATION

This application claims the benefit of U.S. Provisional Patent Application No. 63/268,633 filed Feb. 28, 2022 which is incorporated by reference herein in its entirety.

BACKGROUND

Sound that travels in an acoustic environment, such as a room, can reflect off of surfaces. Each time this acoustic energy reflects off of a surface, some of the acoustic energy may be absorbed by the surface. A listener in the acoustic environment may hear the acoustic dissipate over time. This behavior, where an initial sound is followed by an audible tapering of acoustic energy from that sound, may be referred to as reverberation.

SUMMARY

A device may determine reverberation of a room based on sensing sound in a room. Reverberation time may be determined based on microphone signals generated by microphones of a device. Processing of the microphone signals to determine the reverberation time, however, may be computationally heavy. As such, calculating reverberation time may consume computational resources (e.g., processing bandwidth), be a drain on device energy, or both. It is beneficial for a device to determine the reverberation time of the device's environment in an efficient manner, while still effectively adapting to changes to the environment.

In one aspect, a method, performed by a device, includes obtaining a plurality of microphone signals of a microphone array. The device may detect, based on the plurality of microphone signals, whether the device moves from a first environment to a second environment. In response to detecting the move to the second environment, the device may determine a reverberation time of the second environment. The device may modify a playback audio signal based on the reverberation time.

In one aspect, a method may be performed by a device such that the device operates in different modes for estimating reverberation time based on different criteria. While in a first mode, the device may obtain a plurality of microphone signals of a microphone array and detect, based on the plurality of microphone signals, whether the device moves from a first environment to a second environment. In response to detecting the move to the second environment, the device may transition to a second mode. While in the second mode, the device may determine a reverberation time of the second environment in a manner such that, in the second mode, the device has a power consumption that is higher than the power consumption of the device when in the first mode. A playback audio signal is rendered using the reverberation time.

In one aspect, a device includes a microphone array and a processor that is configured to detect, based on microphone signals of the microphone array, a change in an environment of the device. In response to detecting the change to the environment, the processor is to determine a reverberation time of the environment. The processor is to modify a playback audio signal based on the reverberation time.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Figure 1:
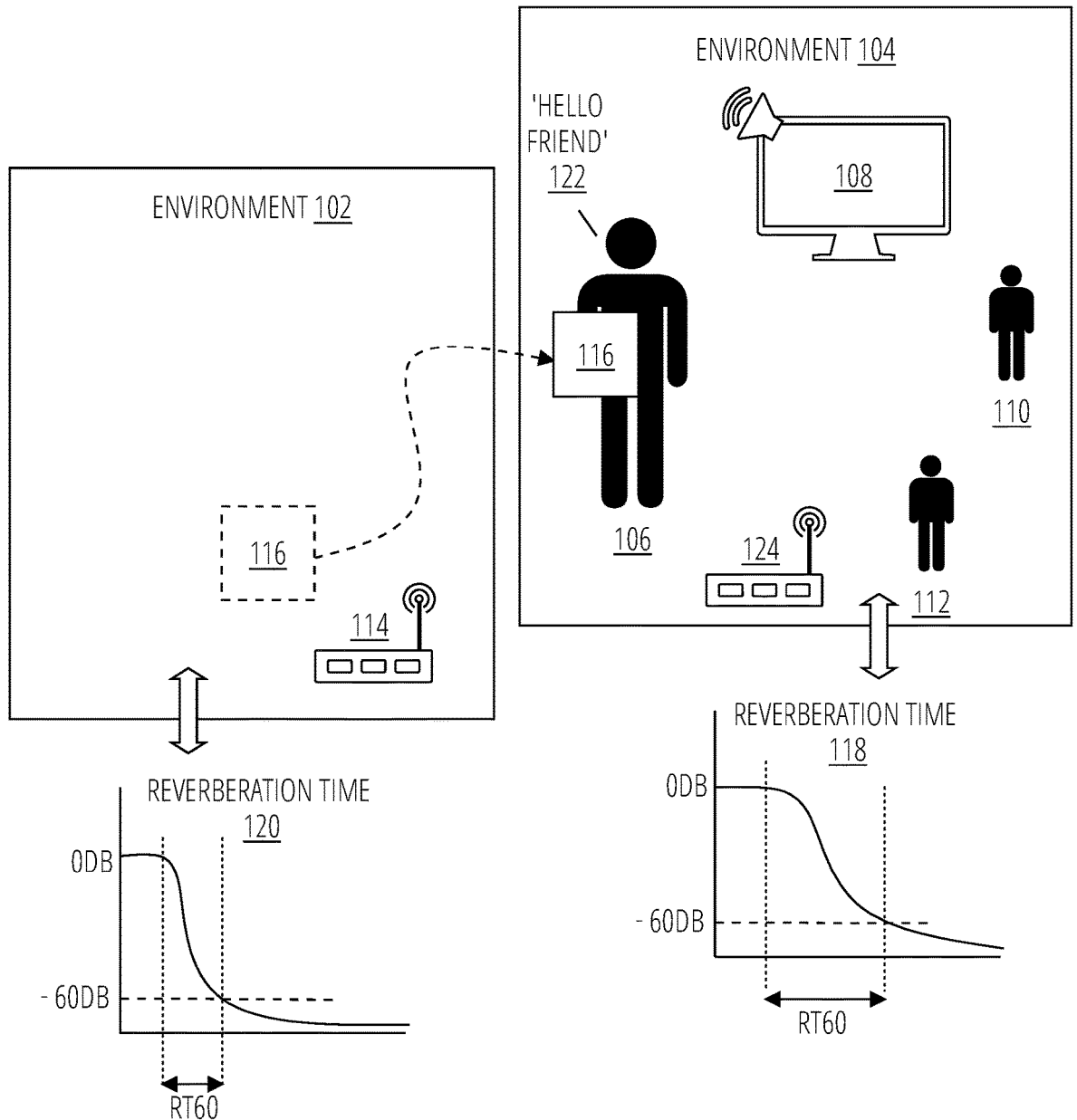
FIG. 1 illustrates an example scenario with an audio processing system, in accordance with some aspects.

Reverberation is a naturally occurring behavior of acoustic energy in a given acoustic environment. The way in which acoustic energy reflects and becomes absorbed in any given environment may differ depending on the shape, size, or volume of the space. Further, objects within the environment, as well as surface materials of objects, walls, floors, ceilings, affect how the acoustic energy reflects, becomes absorbed, and tapers over time.

For example, a small room with high absorption surfaces may have a short reverberation time, because the acoustic energy takes a short path between reflections and with each reflection, much of the energy is absorbed by the surface. Conversely, a large room with low absorption surfaces may have a long reverberation time because of the long path of the acoustic energy and the lower absorption at each reflection.

Reverberation time may be referred to as an amount of time taken for the acoustic energy in a given environment to decay a specified amount. Reverberation time may be characterized by different measurement conventions. For example, an RTx measurement may be calculated as an amount of the time after a sound source terminates, that it takes for the sound pressure level in the space to reduce by 'x' dB, e.g., a reduction of 60 dB for RT60, and a reduction of 30 dB for RT30.

While reverberation occurs naturally in places that hold sound (e.g., an enclosed or partially enclosed space such as a room, a concert hall, a stadium, or other space with walls) reverberation can also be electronically added to audio to provide a sense of space to a listener. The reverberation may be characterized by an impulse response of a room (e.g., a RIR), and applied to an audio signal in a spatial rendering process. Humans can estimate the location of a sound by analyzing the sounds at their two ears. This is known as binaural hearing and the human auditory system can estimate directions of sound using the way sound diffracts around and reflects off of our bodies and interacts with our pinna. These spatial cues can be artificially generated by applying head related impulse responses (HRIR) (e.g., spatial filters) to audio signals. These HRIRs imitate the effect of a user's body and ear geometry on sound by artificially imparting spatial cues into the audio, such as gains and/or delays for each of a plurality of frequency bands. The spatial cues imitate the diffractions, delays, and reflections that are naturally caused by our body geometry and pinna. The spatially filtered audio can be produced by a spatial audio reproduction system (a spatial audio engine) and output through headphones. Such audio may be perceived by a listener as originating from given direction, such as at a location above, below, or to the side of a listener.

A room impulse response (RIR) characterizes the acoustics of a room and how the room responds to a given sound. A room impulse response can characterize an amount of acoustic energy in a room at different times in response to given sound, on a per sub-band level. Thus, the room impulse response may characterize the reverberation qualities of a given space. Similar to reverberation, a room impulse response of a space varies depending on the geometry of a room, size of a room, objects in the room, and/or surface materials in the room.

The direct-to-reverberant energy ratio (DRR) provides an auditory cue for sound source distance perception in listeners. Depending on this ratio, a sound source can be made to sound far away or close to the listener. As such, an immersive spatial audio experience, which can be a component of an augmented reality or mixed reality environment, benefits from a faithful simulation of the user's actual physical space. For example, if a user is sitting in a small bedroom and spatially produced sound mimics the acoustic behavior of a cathedral, this spatial rendering would not be plausible to a user. Thus, to create a plausible distance between a user and a virtual sound source, a spatial audio engine may benefit from accurately characterizing a reverberation of the user's room, which may be used to alter the DRR ratio of a sound in spatialized audio.

FIG. 1 illustrates an example scenario with an audio processing system 108, in accordance with some aspects. Audio processing system 108 may include one or more computing devices such as, for example, a mobile phone, a tablet computer, a desktop computer, a loudspeaker cabinet (e.g., a smart speaker), a headphone set, a head mounted display, or other computing device. The audio processing system may include a plurality of microphones that form a microphone array. The microphones may each generate respective microphone signals. The audio processing system 108 may obtain these signals and process them to detect whether the device changes from a first environment (e.g., environment 102) to a second environment (e.g., environment 104).

In some examples, the first environment 102 is a first physical location (e.g., a living room), and the second environment 104 is a second physical location (e.g., a kitchen) that is different from the first. In other examples, the first environment 102 and second environment 104 may be the same physical location, however, a change may occur to the first environment such as a large window or door opening, or a large sound absorbing object is moved into the space, that substantially alters the acoustic parameters of the room.

In response to detecting the move to the second environment 104, the audio processing system 108 may determine a reverberation time 118 of the second environment. The reverberation time 118 may be defined as an RT60, RT30, or other reverberation time. As discussed, each acoustic space such as environment 104 and environment 102 may have a unique combination of shape, size, geometry, surface materials, and objects in that space, which may determine a unique impulse response or reverberation time of that space. As such, environment 104 may have a reverberation time 118 that is different from reverberation time 120 of environment 102.

The audio processing system 116 may use the reverberation time 118 to modify a playback audio signal based on the reverberation time. As such, the audio processing system may dynamically adjust the reverberation component of a playback audio signal to match that of the user 106, in response to a change in the environment. The playback audio signal may include pre-recorded audio content such as, for example, music, an audiovisual work, an audiobook, a podcast, or other pre-recorded audio content. In some examples, the playback audio signal may include a live recorded audio signal such as, for example, a microphone signal with speech of the user 106, or speech from someone else. In some examples, the audio signal may be modified and sent to another user (e.g., a remote user) so that the remote user hears user 106 in that his or her environment (e.g., environment 104).

In some examples, in response detecting that the system 116 remains in its environment, and having determined that the reverberation time of the its environment is stable, the audio processing system 116 may refrain from determining the reverberation time of its environment. For example, if the audio processing system 116 remains in environment 102, instead of moving to environment 104, the audio processing system 116 may detect that its environment has not changed. Further, the audio processing system 116 may determine the reverberation time 120 of environment 102 to be stable (e.g., unchanged) over a period of time (e.g., 2 seconds or greater). In response, the audio processing system 602 may cease calculating the reverberation time 120 to conserve resources.

A reverberation time 120 may be deemed as stable if the reverberation time changes less than a threshold amount over the period of time. For example, the reverberation time may remain within a threshold percentage with respect to previous estimations of the reverberation time. As such, the audio processing system 116 may calculate a reverberation time of an environment in an efficient manner, by calculating reverberation time when the environment changes, but not when the environment is unchanged and when the reverberation time is deemed to be stable.

In some examples, in response to determining that the reverberation time is stable, the audio processing system 116 may refrain from determining the reverberation time, until a move out of its environment is detected. For example, if the audio processing system has computed a steady reverberation time 118 of environment 104, then the audio processing system may stop determining the reverberation time 118 for that environment. This stable reverberation time may be used by the audio processing system while the environment is unchanged. If, however, audio processing system 116 detects a change of environment (e.g., a move to environment 102), then the audio processing system 116 may obtain and process microphone signals to determine the reverberation time of environment 102.

In some examples, in response to determining that the reverberation time of its environment is unstable, the audio processing system 116 may periodically determine the reverberation time at a desired period. For example, audio processing system 116 may detect a move to environment 104 and determine the reverberation time repeatedly, e.g., at a high rate, until the reverberation time 118 of environment 104 is deemed to be stable (e.g., within a threshold percentage over a period of time or number of cycles). If the calculated reverberation time remains unstable, then the audio processing system may operate in a periodic wake-up mode (e.g., every N seconds). While in this mode, the audio processing system 116 may refrain from calculating the reverberation time of its environment, except for when it wakes every N seconds. If the audio processing system then detects that this reverberation time stabilizes the audio processing system may cease calculating the reverberation time and transition to a triggered wake-up mode, which uses less energy than the periodic wake-up mode. In the triggered wake-up mode, the audio processing system may simply use the stable reverberation time for audio rendering, unless a change of the environment is detected.

The audio processing system 116 may determine reverberation time using a variety of techniques (e.g., a blind room estimation algorithm, a frequency domain adaptive filter (FDAF), or other technique) which may be selected based on sounds detected in the user's environment. Blind room estimation can be understood as estimating reverberation (or other acoustic parameters) of the system's current environment to analyze a response of the environment by using sounds sensed in the space (e.g., by analyzing the microphone signals) and without knowledge of an original transmitted signal (e.g., an artificial test stimuli or an output audio signal) as reference. Thus, a blind room estimation algorithm can be applied to the microphone signals to determine a reverberation time of the environment. A frequency domain adaptive filter can include filtering of the microphone signals, error estimation (between the response in the environment and a reference signal such as output audio or a near-field user's speech), and tap-weight adaption based on the error estimation. Other digital signal processing algorithms can be used to estimate the reverberation time of the user's environment.

In some examples, the audio processing system 116 may detect if near-field speech is present in the plurality of microphone signals. Near-field speech may include speech 122 of a user 106 who may be speaking directly into or near a microphone array of audio processing system 116. In response to the near-field speech being present in the plurality of microphone signals, the audio processing system 116 may measure the reverberation time of its current environment (e.g., environment 104 or environment 102) using the near-field speech as a reference. The near-field speech component may be extracted from the microphone signals (e.g., using a parameterized multi-channel Wiener filter (PMWF) or other filtering technique) and that speech component may be used as a reference to determine the reverberation time of the audio processing system's current environment. When determining the reverberation time using the user's speech, the user's speech may be used as a reference (e.g., with a frequency domain adaptive filter).

In some examples, the audio processing system 116 may detect that one or more sounds other than near-field speech are present in the plurality of microphone signals. For example, the audio processing system may detect sounds (e.g., speech or other sounds) from another device 108, people 110, 112, or other sounds in the far-field. In response to these sounds being present in the far-field, the audio processing system 116 may use a blind estimation algorithm to determine the reverberation time 118 or 120 of its environment (e.g., 104, 102).

In some examples, the audio processing system may detect sounds in the near-field (e.g., user speech) as well as sounds in the far-field. A near-field sound source may be understood as a sound source in the near-field region, where the sound pressure and acoustic particle velocity are not in phase. In this region the sound field does not decrease by 6 dB each time the distance from the source is increased (as it does in the far-field). The near-field may typically include up to a distance from the source equal to about a wavelength of sound or equal to three times the largest dimension of the sound source (whichever is the larger). The far-field of a source typically includes where the near-field ends and extends to infinity. In the far-field, the direct field radiated by sources may decay at the rates such as 3-4 or 6 dB each time the distance from the source is doubled, depending on the type of sound source.

The audio processing system may analyze the microphone signals to classify the current state of the environment. For example, the audio processing system may determine whether a reference signal is available such as a near-field user's speech (e.g., speech 122) or an output audio signal. If so, then the reference signal may be used to determine the reverberation time, as discussed. If not, and if far-field sounds are detected (e.g., sound from device 108, or from people 110 and 112 that are in the far-field), then a blind estimation algorithm may be used to determine the reverberation time. If the reference signal and far-field sounds are both present, then the audio processing system may determine a signal to noise ratio (SNR) between the reference signal and the far-field sounds. If the far-field sounds dominate, then the blind estimation algorithm may be used, however, if the reference signal dominates, then the reference signal may be used as a reference (e.g., with FDAF) to determine the reverberation time.

In some examples, whether or not near-field speech is present may be determined using a speech presence probability (SPP) estimator. Such an estimator, as well as other algorithms and techniques, may include an artificial neural network, which may be trained to determine a classification or score based on a given input set of data. For example, the SPP estimator may be trained to determine whether near-field speech 122 is present or provide a probability score based on the microphone signals of the audio processing system 116.

The audio processing system 116 may analyze the microphone signals to monitor a change in room acoustics. If the changes exceed a threshold amount, the audio processing system may deem its environment to be changed. This change in room acoustics may indicate a change from one physical location to another, or a physical change to the same location. In some cases, determining the room acoustics may include one or more techniques such as, for example, monitoring the microphone signals for a far-field audio signal that may be continuously captured from the environment (e.g., a room) and/or monitoring a near-field signal such as speech. The audio processing system may analyze the microphone signals for signal statistics that may characterize the acoustic response of the environment (e.g., the room impulse response). The audio processing system may estimate the room impulse response or a proxy for the room impulse response. Such techniques may not be sufficiently accurate to estimate the reverberation time of the room, however, they may still be used to track changes in the room acoustics.

Such signal statistics may be monitored in the autocorrelation domain. In some examples, the audio processing system may analyze the microphone signals to monitor statistics such as, for example, the autocorrelation of any far-field signal, averaged across a number of time frames, which can be assimilated to the autocorrelation of the RIR. Such a blind method does not need prior knowledge of the excitation signal. Additionally, or alternatively, the audio processing system may monitor statistics such as the autocovariance of the near-field signal and the cross-correlation of the near- and far-field signals, which may be linked by the same autocorrelation of the RIR. This is an "informed" technique that uses knowledge of the excitation signal (for example, own speech). Having determined an estimate of the autocorrelation of the RIR, acoustic changes can then be monitored in a number of ways such as, for example, by tracking the RIR autocorrelation decay, or its energy.

Such signal statistics may also be monitored in the cepstral domain. Techniques may be based on homomorphic deconvolution. For example, using a blind estimation technique, the real cepstrum of any far-field signal, averaged across a number of time frames, may be assimilated to the real cepstrum of the RIR. In some examples, with knowledge of a reference signal, the real cepstrum of a near-field signal (e.g., speech or other reference signal) may be subtracted from the real cepstrum of the resulting far-field signal, which may also be assimilated to the real cepstrum of the RIR. The changes in that real cepstrum, which indirectly indicates changes in the RIR, can be monitored by tracking the shape of the real cepstrum, or its energy.

In some examples, the audio processing system can detect acoustic changes in an environment by tracking the estimated T60s themselves as given by either the blind estimation algorithm or the RIR-based FDAF algorithm, if available.

In some aspects, the audio processing system 116 may detect whether the device moves from a first environment (e.g., environment 102) to a second environment (e.g., environment 104) based on non-microphone based sources. For example, audio processing system 116 may use one or more geofencing algorithms to detect a change of location of the audio processing system 116. If this location changes, then the audio processing system 116 may deem its environment to be changed, and respond accordingly such as by determining the reverberation time of its environment, as described in other sections. Additionally, or alternatively, the audio processing system may leverage data from a camera, global positioning system (GPS), or Wi-Fi, to determine whether its current environment is changed. For example, computer vision and/or visual odometry may be applied to camera images to determine if the environment of the audio processing device is changed. The audio processing system may obtain GPS data to determine whether it has moved from one location to another. The audio processing system may use a Wi-Fi positioning system (WPS) that uses the characteristics of nearby Wi-Fi hotspots (e.g., 114, 124) and other wireless access points to discover where the audio processing system 116 is located. Such characteristics may include signal strength, SSID, MAC address, or other characteristics.

Audio processing system 116 may determine other acoustic parameters other than reverberation, in response to detecting the change to the environment or a move from one environment to another. For example, the audio processing system may determine a room timbre or equalization curve. The determination of such parameters may vary (e.g., in a periodic mode, in a wake-up mode, based on stability or based on change in environment) as described with respect to reverberation. As such, device energy and computational resources may be managed efficiently.

The reverberation time, these other acoustic parameters, or a combination thereof, may be used to render a playback audio signal. For example, a room impulse response (RIR) of the current environment of the audio processing system 116 may be generated based at least on the reverberation time. The RIR may be a binaural room impulse response (BRIR). The audio processing system 116 may spatially render the playback audio signal using the room impulse response to generate binaural audio that includes a left audio channel and a right audio channel. The audio channels may be used to drive a left and right speaker of a headphone set that is worn in-ear, on-ear, or over-ear. As such, the reverberation time 118 or 120 may be used to create a spatial audio effect that is representative of the physical space of the user, thereby creating a realistic and dynamic experience.

It should be understood that audio processing system 116 may include a single device, or a combination of devices. In some cases, hardware and software functionality may be distributed across multiple devices of the system. For example, an audio processing system may include a headphone set and a mobile device (e.g., a mobile phone, a tablet computer, laptop, or other mobile device). The microphone array may be integral to any of the devices. Processing of the microphone signals may be performed by the same device on which those microphones are a part of, or a different device. Detection of environment changes and determination of reverberation may also be performed on separate devices, or on a common device.

Figure 2:
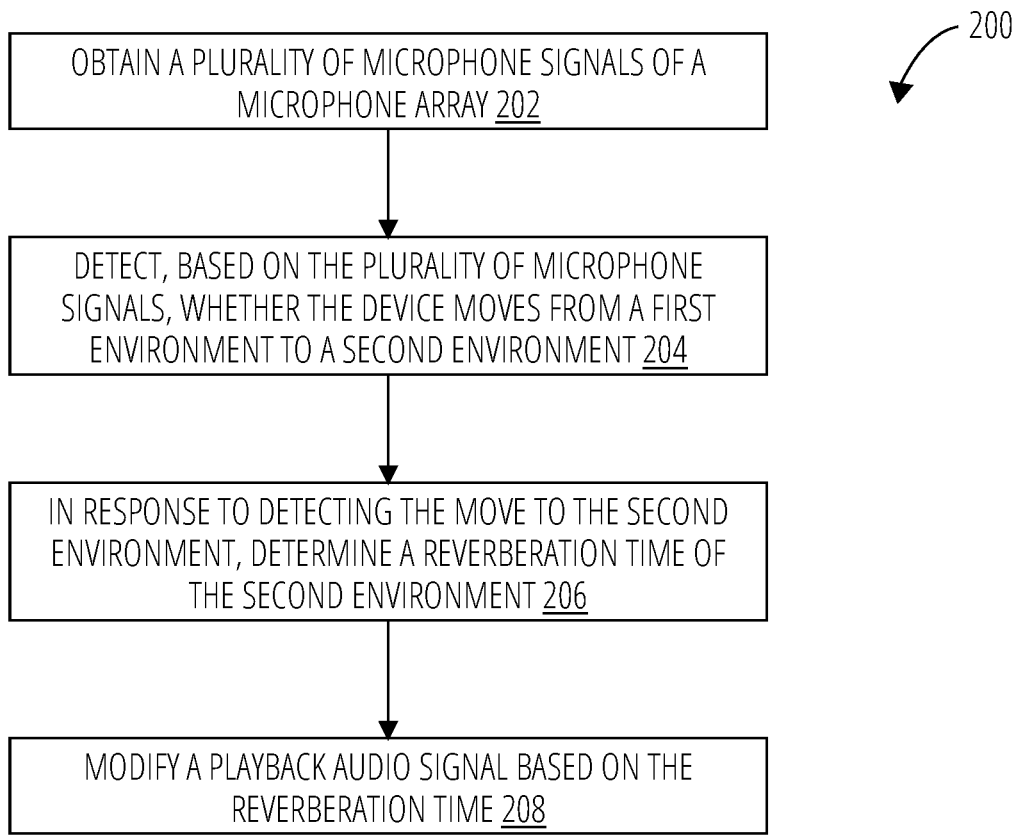
FIG. 2 illustrates a method for calibrating audio to an environment of a user, in accordance with some aspects.

FIG. 2 illustrates a method 200 for calibrating audio to an environment of a user, in accordance with some aspects. The method may be performed with various aspects described. The method may be performed by a device or an audio processing system (e.g., audio processing system 116) that may include hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. Although specific function blocks ("blocks") are described in the method, such blocks are examples. That is, aspects are well suited to performing various other blocks or variations of the blocks recited in the method. It is appreciated that the blocks in the method may be performed in an order different than presented, and that not all of the blocks in the method may be performed.

At block 202, a device may obtain a plurality of microphone signals of a microphone array. As discussed, the microphone array may be integral to or separate from the device. The microphone array may sense sounds, if present, in the environment of the device.

At block 204, the device may detect, based on the plurality of microphone signals, whether the device moves from a first environment to a second environment. For example, the device may monitor acoustic parameters of its current environment. If one or more of the acoustic parameters change (e.g., a threshold amount), then the device may infer that it has moved from its current environment to a new environment, for example, based on signal statistics that indicate may indicate a change to the room impulse response of the environment.

At block 206, in response to detecting the move to the second environment, the device may determine a reverberation time of the second environment. As discussed, reverberation time may be determined using a near-field speech signal, or from sounds in the far-field. Selecting which technique to use for determining the reverberation time, may depend on whether near-field speech is detected, whether far-field sounds are detected, or on a strength comparison between the near-field speech and far-field sounds, if both are detected.

At block 208, the device may modify a playback audio signal based on the reverberation time. A room impulse response may be generated that characterizes this reverberation time. The room impulse response may be applied to the playback audio signal such that the resulting audio has the reverberation of the device's environment when heard by a listener upon play back. The reverberation time and room impulse response may be frequency dependent. For example, the reverberation time of the current environment of the device may include a separate reverberation time for each frequency band in which the reverberation time is estimated in.

Figure 3:
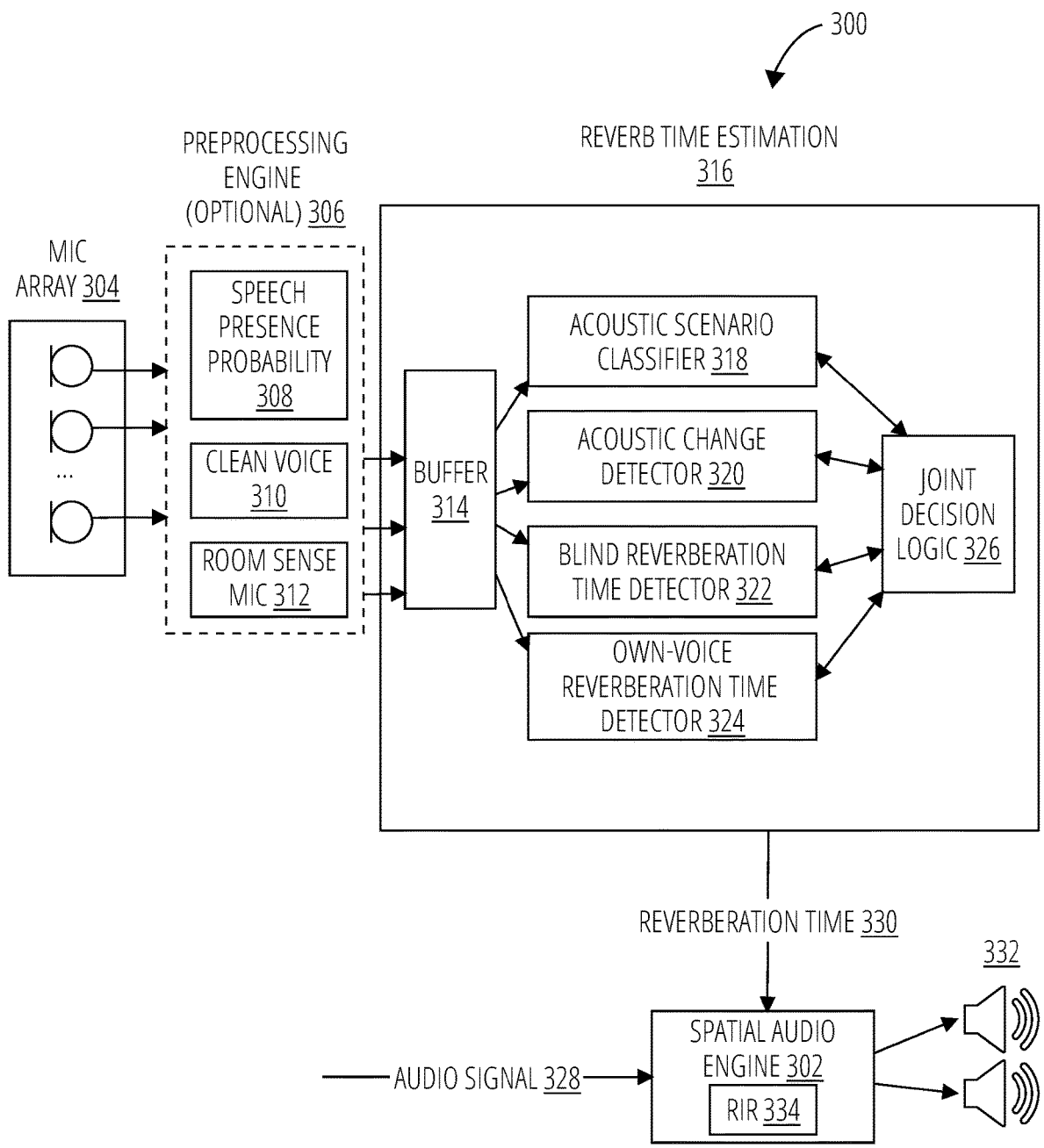
FIG. 3 shows an audio processing system with components for reverberation time estimation, in accordance with some embodiments.

FIG. 3 shows an audio processing system 300 with components for reverberation time estimation, in accordance with some embodiments. The audio processing system 300 shown here may be an example of the audio processing system discussed in other sections, such as, for example, audio processing system 116. A microphone array 304 may include a plurality of microphones. Each microphone may have a fixed and/or known position. An optional preprocessing engine 306 may analyze the microphone signals and obtain information in the microphone signals that may be useful to downstream components.

For example, preprocessing engine 306 may include a speech presence probability block 308 that may determine a probability score indicating how likely it is that the microphone signals carry speech, such as, for example, near-field speech. Clean voice block 310 may apply a filter (e.g., a PMWF) to the microphone signals to obtain a clean speech signal (e.g., with reduced background noises). A room sense mic block 312 may pick a reference audio signal among the microphone array 304 that best captures ambient sounds in the environment, such as non-near-field speech.

At reverberation time estimation block 316, a buffer 314 may capture the audio information generated by the preprocessing engine (e.g., from 308, 310, 312), and/or the raw microphone signals from microphone array 304, over a given period of time (e.g., 30 seconds, 60 seconds, etc.). The reverberation estimation block 316 may include sub-components 318, 320, 322, and 324 that may each be turned on or off at different times under different situations, to manage power and computational load of the audio processing system.

Acoustic scenario classifier 318 may analyze the audio information generated by the preprocessing engine, and/or the microphone signals, and classify a current scenario or state of the system's environment. For example, if the SPP 308 indicates presence of the near-field sounds (e.g., speech), and the room sense mic 312 indicates ambient sounds to be low or non-existent, then the acoustic scenario classifier 318 may classify the current scenario of the environment as being own-voice dominant. In another example, if the SPP 308 does not indicate presence of near-field sounds, and ambient sounds (e.g., far-field sounds) are picked up by the room sense mic 312, then the acoustic scenario classifier 318 may classify the scenario as being ambient-dominant. In another example, if no sounds are detected in the microphone signals (e.g., no near-field or far-field sounds), then the scenario may be classified as quiet. In another example, if both near-field sounds and far-field sounds are detected, then the acoustic scenario classifier 318 may classify the scenario as being own-voice dominant if the SNR is high (indicating a strong near-field presence and/or weak ambience) and ambient-dominant if the SNR is low (indicating a weak near-field presence and/or strong ambience).

Acoustic change detector 320 may monitor the microphone signals over time (e.g., as kept in buffer 314) to determine acoustic properties of the room, such as, for example, by monitoring signal statistics in the microphone signals, as discussed. A change in one or more of the acoustic properties may indicate that a change of environment has occurred. As such, the acoustic change detector 320 may signal this change to joint decision logic 326.

Blind reverberation time detector 322 may use a blind source estimation algorithm to estimate the reverberation of the system's environment, as sensed by the microphone array 304. Own-voice reverberation time detector 324 may use the near-field speech contained in the microphone signals, to sense reverberation. As discussed, each of these reverberation time detectors may be turned on or off individually (e.g., based on joint decision logic 326).

Joint decision logic 326 may obtain various information from components 318, 320, 322, and 324, and manage operation of these components (e.g., on or off) based on the information. For example, acoustic change detector 320 may observe a change to one or more acoustic parameters and signal this change to joint decision logic 326. In response, joint decision logic 326 may turn on blind reverberation detector 322 and/or own-voice reverberation time detector 324.

Joint decision logic 326 may select which of 322 and 324 to turn on, based on the scenario classification of the environment, as determined by acoustic scenario classifier 318. For example, the scenario classification is own-voice dominant, then joint decision logic may turn on own-voice reverberation time detector 324, and turn off blind reverberation time detector 322. Similarly, if the scenario classification is ambient dominant, then joint decision logic 326 may turn on blind reverberation time detector 322 and turn off own-voice reverberation time detector 324. If the scenario classification is silent, joint decision logic 326 may turn off the blind reverberation time detector 322 and the own-voice reverberation time detector 324.

Joint decision logic 326 may obtain reverberation time 330 from blind reverberation time detector 322 or own-voice reverberation time detector 324 and determine whether the reverberation time of an environment is stable (e.g., relatively constant for a predetermined period of time). As discussed, if reverberation time 330 is stable, joint decision logic may turn off blocks 322 and block 324. In some aspects, joint decision logic may transition the system into triggered wake-up mode that does not compute the reverberation time. Joint decision logic may transition out of this state in response to the acoustic change detector 320 signaling a change from one environment to another or a change to the environment.

In some aspects, if a change to the environment is detected (e.g., signaled by block 320), joint decision logic 326 may turn on blocks 318, 322, and 324, until the acoustic scenario classifier 318 classifies the changed environment, or until the reverberation time stabilizes, or both. In some examples, if the reverberation time is unstable (e.g., over a threshold period of time or number of cycles), joint decision logic 326 may transition to a periodic wake-up mode, and periodically determine the reverberation time 330. At some point, if the reverberation time 330 stabilizes, joint decision logic may transition the system to a triggered wake-up mode.

In such a manner, joint decision logic may determine whether or not to estimate reverberation time 330, determine or how often to estimate reverberation time 330, and select a suitable algorithm with which to estimate reverberation time 330. Accuracy of the reverberation time 330 may be improved by selecting the suitable algorithm based on the current scenario of the environment. If no sounds are present and/or if the reverberation time 330 is stable, reverberation time 330 of the system's current environment is not calculated.

The audio processing system 300 may include a spatial audio engine 302 that may generate a room impulse response (RIR) 334 based on the reverberation time 330. In some examples, the room impulse response may be selected from a library of stock room impulse responses that most closely corresponds to the reverberation time 330. The spatial audio engine 302 may apply RIR 334 to one or more playback audio signals 328 (e.g., with convolution), to generate spatialized binaural audio. The binaural audio may include a left and right audio channel that are used to drive a left and right speaker 332 of a headphone set. A listener may thus experience the spatialized audio with reverberation that resembles or coincides with the physical environment of the user, and this experience may dynamically adjust as that physical environment changes.

Figure 4:
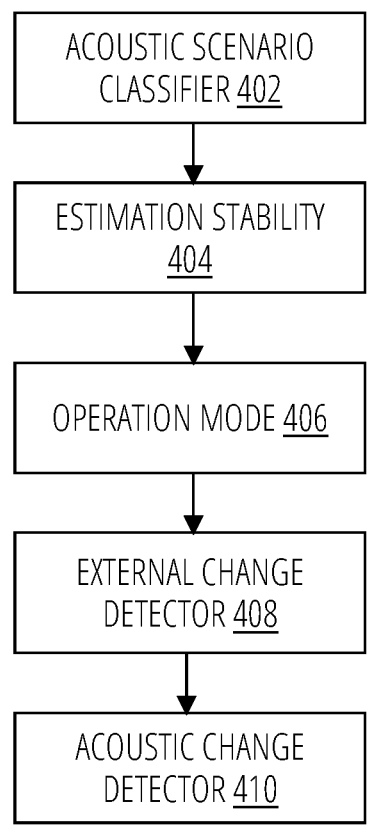
FIG. 4 shows a workflow of an audio processing system, according to some embodiments.

FIG. 4 shows a workflow 412 of an audio processing system, according to some embodiments. The workflow may be performed by audio processing system 116, audio processing system 300, or with other aspects of the present disclosure. The workflow may be performed periodically or per-cycle of a processor.

At acoustic scenario classifier 402, microphone signals are analyzed to determine if near-field speech is present in the microphone signals, if far-field sound is present, and/or if the environment is generally noisy. A scenario classification can be made, such as, for example, 'own-voice dominant', 'ambient dominant', or 'silent'. As discussed, based on how the environment is classified, one or more estimation techniques may be selected to determine the reverberation time.

At estimation stability block 404, the estimated reverberation time may be monitored over two or more cycles to determine if the reverberation time is stable. As discussed, the reverberation time may be determined by different estimation techniques (e.g., blind estimation or based on near-field speech).

At operation mode block 406, the stability of the reverberation time and/or other factors (e.g., how much battery time the system has, how much computational resources are available, etc.) may be considered to determine what mode the system will operate in or transition to. For example, if the reverberation time is stable (e.g., less than 'x' amount of change over 'y' period of time), then the reverberation time may be deemed as stable and the reverberation estimation blocks may be turned off, thereby conserving energy and computational resources. If the reverberation time is not stable over a period of time, then the reverberation estimation may be performed periodically (e.g., once per second, once every two seconds, etc.), or until it becomes stable.

At external change detector 408, non-microphone based solutions may be used to determine if a change to the environment of the system has occurred. As discussed, the system may determine if there is a change of environment or to the environment based on camera information, GPS, Wi-Fi, or other geolocation algorithms. If a change is detected here, joint decision logic may treat such a change the same as if a change is detected acoustically, as described in other sections.

At acoustic change detector 410, the microphone signals may be analyzed to determine if the room has changed. Acoustic parameters such as signal statistics of a near-field and far-field signal may be monitored. If one or more of such parameters undergoes a change (e.g., greater than a threshold amount), then the acoustic change detector may signal a change of or to the environment. The system may further change operation mode based on when a change is detected, as discussed.

Figure 5:
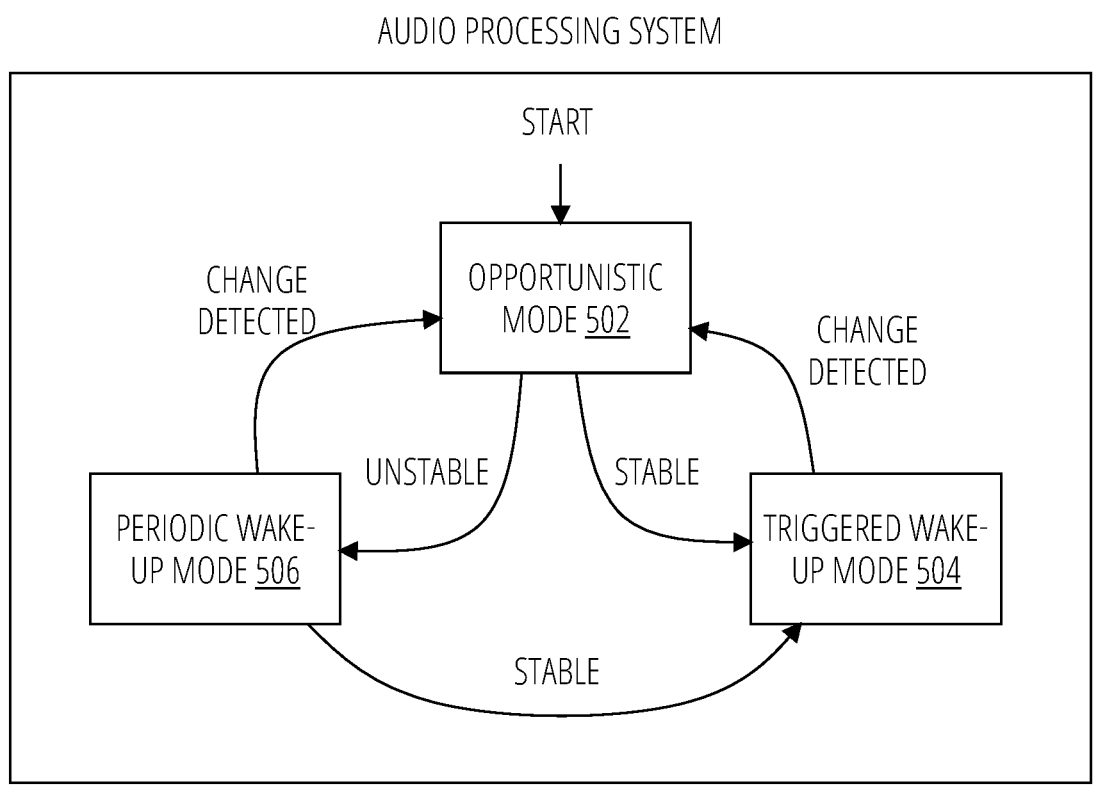
FIG. 5 illustrates an example of operational modes of an audio processing system, in accordance with some aspects.

FIG. 5 illustrates an example of operational modes of an audio processing system, in accordance with some aspects. The audio processing system shown in this figure may be representative of those shown in other figures. Upon start-up, the system may enter an opportunistic mode 502. During this mode, the system may work hard and fast to determine a reverberation time of its environment. For example, during such a mode, all components such as the acoustic scenario classifier, acoustic change detector, blind reverberation time detector, and own-voice reverberation time detector (e.g., as shown in FIG. 3), may be turned on by default. Some may be turned off while in this mode depending on factors described in other sections.

If the reverberation time is determined to be stable, then the system may transition to a triggered wake-up mode 504. If the reverberation time is unstable, for example, the environment is silent, or the device is moving in a user's pocket, then the audio processing system may transition to a periodic wake-up mode 506.

In the triggered wake-up mode 504, the system may cease determining the reverberation time, given that it is stable. The system may still determine if the environment changes (e.g., blocks 408 or 410 of FIG. 4) in such a mode. If an environment change is detected, the system may transition back to opportunistic mode 502.

As such, whether in triggered wake-up mode 504 or in periodic wake-up mode 506, the system may transition to opportunistic mode 502 in response to detecting an environment change. The power consumption of the opportunistic mode 502 may be greater than that of the triggered wake-up mode and the periodic wake-up mode. The periodic wake-up mode 506 may have a higher power consumption than the triggered wake-up mode 504.

In the periodic wake-up mode 506, the system may cease determining reverberation time, except for at a pre-determined period (e.g., every N seconds), thereby conserving energy and computational resources. If a change to the environment is detected (e.g., at blocks 408 or 410 of FIG. 4), the system may transition to opportunistic mode 502. If the reverberation time does stabilize, then the system may transition to triggered wake-up mode 504. As such, the audio processing system may operate in an efficient manner that estimates reverberation opportunistically and in a manner that dynamically adjusts with a user's changing environment.

Figure 6:
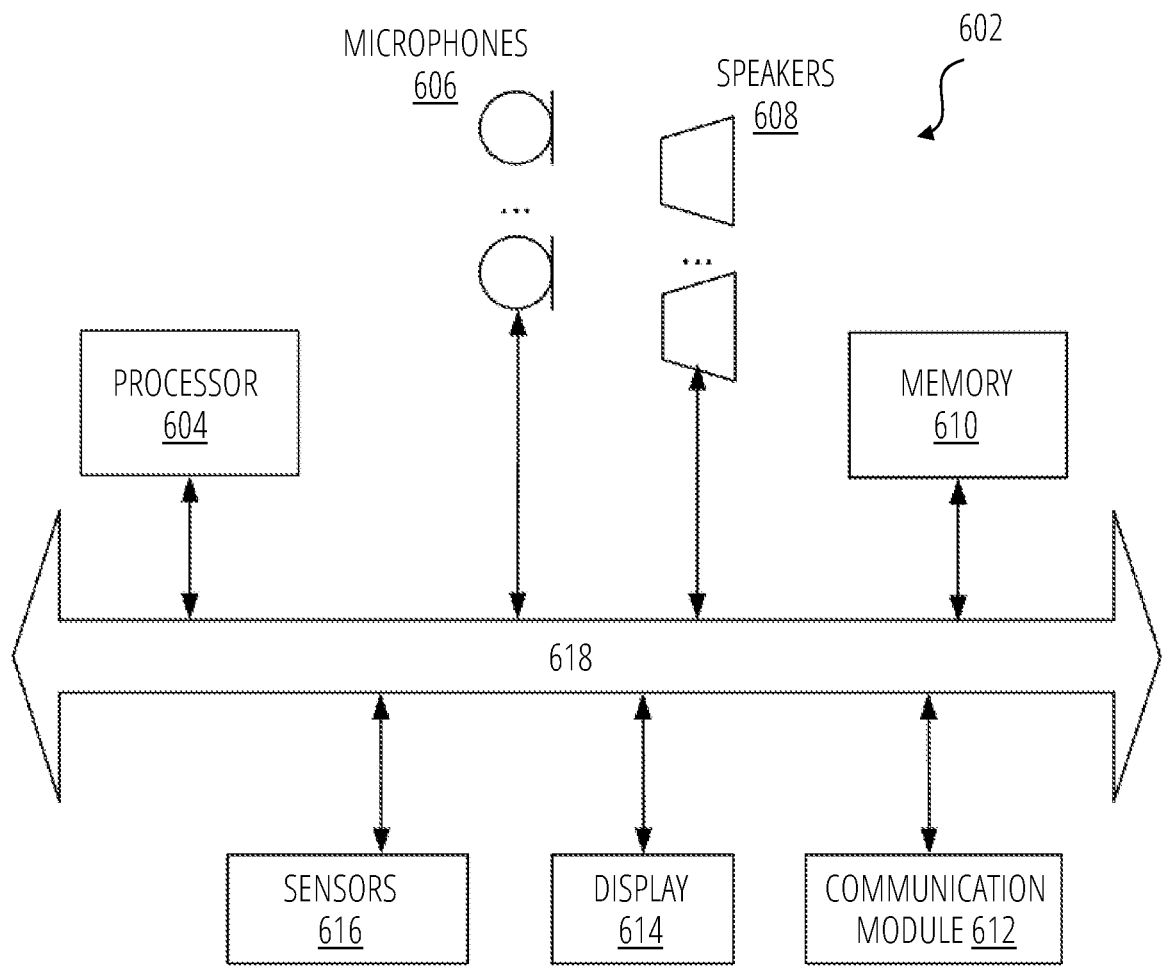
FIG. 6 illustrates an example of an audio processing system, in accordance with some aspects.

FIG. 6 illustrates an example of an audio processing system, in accordance with some aspects. The audio processing system can be a computing device such as, for example, a desktop computer, a tablet computer, a smart phone, a computer laptop, a smart speaker, a media player, a household appliance, a headphone set, a head mounted display (HMD), smart glasses, an infotainment system for an automobile or other vehicle, or other computing device. The system can be configured to perform the method and processes described in the present disclosure.

Although various components of an audio processing system are shown that may be incorporated into headphones, speaker systems, microphone arrays and entertainment systems, this illustration is merely one example of a particular implementation of the types of components that may be present in the audio processing system. This example is not intended to represent any particular architecture or manner of interconnecting the components as such details are not germane to the aspects herein. It will also be appreciated that other types of audio processing systems that have fewer or more components than shown can also be used. Accordingly, the processes described herein are not limited to use with the hardware and software shown.

The audio processing system can include one or more buses 618 that serve to interconnect the various components of the system. One or more processors 604 are coupled to bus as is known in the art. The processor(s) may be microprocessors or special purpose processors, system on chip (SOC), a central processing unit, a graphics processing unit, a processor created through an Application Specific Integrated Circuit (ASIC), or combinations thereof. Memory 610 can include Read Only Memory (ROM), volatile memory, and non-volatile memory, or combinations thereof, coupled to the bus using techniques known in the art. Sensors 616 can include an IMU and/or one or more cameras (e.g., RGB camera, RGBD camera, depth camera, etc.) or other sensors described herein. The audio processing system can further include a display 614 (e.g., an HMD, or touchscreen display).

Memory 610 can be connected to the bus and can include DRAM, a hard disk drive or a flash memory or a magnetic optical drive or magnetic memory or an optical drive or other types of memory systems that maintain data even after power is removed from the system. In one aspect, the processor 604 retrieves computer program instructions stored in a machine readable storage medium (memory) and executes those instructions to perform operations described herein.

Audio hardware, although not shown, can be coupled to the one or more buses in order to receive audio signals to be processed and output by speakers 608. Audio hardware can include digital to analog and/or analog to digital converters. Audio hardware can also include audio amplifiers and filters. The audio hardware can also interface with microphones 606 (e.g., microphone arrays) to receive audio signals (whether analog or digital), digitize them when appropriate, and communicate the signals to the bus.

Communication module 612 can communicate with remote devices and networks through a wired or wireless interface. For example, communication module can communicate over known technologies such as TCP/IP, Ethernet, Wi-Fi, 3G, 4G, 5G, Bluetooth, ZigBee, or other equivalent technologies. The communication module can include wired or wireless transmitters and receivers that can communicate (e.g., receive and transmit data) with networked devices such as servers (e.g., the cloud) and/or other devices such as remote speakers and remote microphones.

It will be appreciated that the aspects disclosed herein can utilize memory that is remote from the system, such as a network storage device which is coupled to the audio processing system through a network interface such as a modem or Ethernet interface. The buses can be connected to each other through various bridges, controllers and/or adapters as is well known in the art. In one aspect, one or more network device(s) can be coupled to the bus. The network device(s) can be wired network devices (e.g., Ethernet) or wireless network devices (e.g., Wi-Fi, Bluetooth). In some aspects, various aspects described (e.g., simulation, analysis, estimation, modeling, object detection, etc.,) can be performed by a networked server in communication with the capture device.

Various aspects described herein may be embodied, at least in part, in software. That is, the techniques may be carried out in an audio processing system in response to its processor executing a sequence of instructions contained in a storage medium, such as a non-transitory machine-readable storage medium (e.g. DRAM or flash memory). In various aspects, hardwired circuitry may be used in combination with software instructions to implement the techniques described herein. Thus the techniques are not limited to any specific combination of hardware circuitry and software, or to any particular source for the instructions executed by the audio processing system.

In the description, certain terminology is used to describe features of various aspects. For example, in certain situations, the terms "module", "processor", "unit", "renderer", "system", "device", "filter", "engine", "block", "detector", "simulation", "model", and "component", are representative of hardware and/or software configured to perform one or more processes or functions. For instance, examples of "hardware" include, but are not limited or restricted to an integrated circuit such as a processor (e.g., a digital signal processor, microprocessor, application specific integrated circuit, a micro-controller, etc.). Thus, different combinations of hardware and/or software can be implemented to perform the processes or functions described by the above terms, as understood by one skilled in the art. Of course, the hardware may be alternatively implemented as a finite state machine or even combinatorial logic. An example of "software" includes executable code in the form of an application, an applet, a routine or even a series of instructions. As mentioned above, the software may be stored in any type of machine-readable medium.

Some portions of the preceding detailed descriptions have been presented in terms of algorithms and symbolic representations of operations on data bits within a computer memory. These algorithmic descriptions and representations are the ways used by those skilled in the audio processing arts to most effectively convey the substance of their work to others skilled in the art. An algorithm is here, and generally, conceived to be a self-consistent sequence of operations leading to a desired result. The operations are those requiring physical manipulations of physical quantities. It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of an audio processing system, or similar electronic device, that manipulates and transforms data represented as physical (electronic) quantities within the system's registers and memories into other data similarly represented as physical quantities within the system memories or registers or other such information storage, transmission or display devices.

The processes and blocks described herein are not limited to the specific examples described and are not limited to the specific orders used as examples herein. Rather, any of the processing blocks may be re-ordered, combined or removed, performed in parallel or in serial, as desired, to achieve the results set forth above. The processing blocks associated with implementing the audio processing system may be performed by one or more programmable processors executing one or more computer programs stored on a non-transitory computer readable storage medium to perform the functions of the system. All or part of the audio processing system may be implemented as, special purpose logic circuitry (e.g., an FPGA (field-programmable gate array) and/or an ASIC (application-specific integrated circuit)). All or part of the audio system may be implemented using electronic hardware circuitry that include electronic devices such as, for example, at least one of a processor, a memory, a programmable logic device or a logic gate. Further, processes can be implemented in any combination hardware devices and software components.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

While certain aspects have been described and shown in the accompanying drawings, it is to be understood that such aspects are merely illustrative of and not restrictive, and the disclosure is not limited to the specific constructions and arrangements shown and described, since various other modifications may occur to those of ordinary skill in the art.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A method, performed by a device, comprising
    obtaining a plurality of microphone signals of a microphone array;
    detecting, based on the plurality of microphone signals, whether the device moves from a first environment to a second environment;
    in response to detecting the move to the second environment, determining a reverberation time of the second environment; and
    modifying a playback audio signal based on the reverberation time.

2. The method of claim 1, further comprising, in response detecting that the device remains in the first environment, and having determined that the reverberation time of the first environment is stable, refraining from determining the reverberation time of the first environment.

3. The method of claim 1, further comprising, in response to determining that the reverberation time is stable, refraining from determining the reverberation time, until a move out of the second environment is detected.

4. The method of claim 1, further comprising, in response to determining that the reverberation time of the first environment is unstable, periodically determining the reverberation time at a desired period.

5. The method of claim 1, wherein determining the reverberation time includes detecting if near-field speech is present in the plurality of microphone signals, and measuring the reverberation time using the near-field speech as a reference, in response to the near-field speech being present in the plurality of microphone signals.

6. The method of claim 1, wherein determining the reverberation time includes detecting that one or more sounds other than near-field speech are present in the plurality of microphone signals, and using a blind estimation algorithm to determine the reverberation time of the first environment in response to the one or more sounds being present in the plurality of microphone signals.

7. The method of claim 1, further comprising, detecting whether the device moves from the first environment to the second environment based on one or more of a geofencing algorithm, a camera, GPS, or Wi-Fi, determining the reverberation time of the second environment in response to detecting the move to the second environment.

8. The method of claim 1, further comprising determining a room timbre in response to detecting the move to the second environment.

9. The method of claim 1, further comprising determining an equalization curve in response to detecting the move to the second environment.

10. The method of claim 1, wherein modifying the playback audio signal based on the reverberation time includes generating a room impulse response of the second environment based at least on the reverberation time; and spatially rendering the playback audio signal using the room impulse response.

11. A method, performed by a device, comprising
    while in a first mode that has a first power consumption, obtaining a plurality of microphone signals of a microphone array;
    detecting, based on the plurality of microphone signals, whether the device moves from a first environment to a second environment; and
    in response to detecting the move to the second environment, transitioning to a second mode having a second power consumption that is higher than the first; and
    while in the second mode, determining a reverberation time of the second environment, wherein a playback audio signal is rendered using the reverberation time.

12. The method of claim 11, wherein the device enters the first mode in response to determining that the reverberation time is stable of the first environment is stable.

13. The method of claim 11, wherein in the first mode, the device does not determine the reverberation time of the first environment.

14. The method of claim 11, further comprising, in response to determining that the reverberation time of the first environment is unstable, transitioning into a third mode and periodically determining the reverberation time at a desired period while in the third mode.

15. The method of claim 11, wherein determining the reverberation time includes detecting if near-field speech is present in the plurality of microphone signals, and measuring the reverberation time using the near-field speech as a reference, in response to the near-field speech being present in the plurality of microphone signals.

16. The method of claim 11, wherein determining the reverberation time includes detecting that one or more sounds in a far-field are present in the plurality of microphone signals, and using a blind estimation algorithm to determine the reverberation time of the first environment in response to the one or more sounds being present in the plurality of microphone signals.

17. A device, comprising:
a microphone array; and a processor configured to
detect, based on microphone signals of the microphone array, whether a change in an environment of the device;
in response to detecting the change to the environment, determine a reverberation time of the environment; and
modify a playback audio signal based on the reverberation time.

18. The device of claim 17, wherein the processor is further configured to, in response detecting a lack of the change to the environment, and determining that the reverberation time of the environment is stable, refraining from determining the reverberation time of the environment.

19. The device of claim 17, wherein the processor is further configured to, in response to determining that the reverberation time is stable, the device is configured to pause from determining the reverberation time, until the change to the environment is detected.

20. The device of claim 19, wherein determining that the reverberation time is unstable is separate from detecting the change to the environment.

21. The device of claim 17, wherein the processor is further configured to, in response to determining that the reverberation time of the environment is unstable, the device is configured to periodically determine the reverberation time at a desired period.

22. The device of claim 17, wherein the device is a headphone set.

23. The device of claim 17, wherein the device is a mobile phone.

24. The device of claim 17, wherein the device is a smart loudspeaker.

* * * * *